US008841831B2

(12) United States Patent
Takei

(10) Patent No.: US 8,841,831 B2
(45) Date of Patent: Sep. 23, 2014

(54) LIGHT EMITTING DEVICE, AND ILLUMINATION APPARATUS AND LUMINAIRE USING SAME

(71) Applicant: Panasonic Corporation, Osaka (JP)

(72) Inventor: Naoko Takei, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/786,919

(22) Filed: Mar. 6, 2013

(65) Prior Publication Data

US 2013/0241391 A1 Sep. 19, 2013

(30) Foreign Application Priority Data

Mar. 13, 2012 (JP) ................................ 2012-055421

(51) Int. Cl.
*H01J 1/62* (2006.01)
*H01J 63/04* (2006.01)

(52) U.S. Cl.
USPC ........... 313/498; 313/483; 313/500; 313/501; 313/502; 313/503; 313/504; 313/505; 313/506; 313/112; 313/110

(58) Field of Classification Search
None
See application file for complete search history.

(56) References Cited

U.S. PATENT DOCUMENTS

| | | | | |
|---|---|---|---|---|
| 8,716,729 | B2 * | 5/2014 | Wiesmann et al. | 257/98 |
| 8,773,009 | B2 * | 7/2014 | Aoki et al. | 313/498 |
| 2011/0049551 | A1 | 3/2011 | Wiesmann et al. | |

FOREIGN PATENT DOCUMENTS

| | | |
|---|---|---|
| JP | H10-123989 | 5/1998 |
| JP | 2001-66421 | 3/2001 |
| JP | 2009-99633 | 5/2009 |
| JP | 2010-182724 | 8/2010 |
| JP | 2011-507287 | 3/2011 |
| JP | 2011-134829 | 7/2011 |

* cited by examiner

*Primary Examiner* — Natalie Walford
(74) *Attorney, Agent, or Firm* — Renner, Otto, Boisselle & Sklar, LLP

(57) ABSTRACT

A light emitting device includes a first luminous body having a first light source and a long wavelength cut-off filter; and a second luminous body generating light of different color from that of the first luminous body, and having a second light source and a short wavelength cut-off filter. The first and the second light source emit light in a first wavelength range and a second wavelength range extending to a longer wavelength side than the first wavelength range while overlapping with the first wavelength range, respectively. The long and the short wavelength cut-off filter cut off light having a wavelength longer than a first set wavelength and shorter longer than a second set wavelength, respectively. Thus, light emitted from the first luminous body and light emitted from the second luminous body are mixed together, such that light in between the first set wavelength and the second set wavelength is reduced.

21 Claims, 23 Drawing Sheets

10

3
1
6
4
5
2

LIGHT EMITTED FROM SECOND LUMINOUS BODY
VIOLET
BLUE
GREEN
YELLOW
RED
RED LIGHT
YELLOW TO RED LIGHT
BLUE LIGHT
400
500
600
700
800
SECOND WAVELENGTH RANGE
SECOND LIGHT SOURCE: BLUE LED + YELLOW TO RED PHOSPHOR
SECOND SET WAVELENGTH OF SHORT WAVELENGTH CUT-OFF FILTER: ABOUT 600 nm

LIGHT OBTAINED BY MIXING LIGHT EMITTED FROM FIRST LUMINOUS BODY AND LIGHT EMITTED FROM SECOND LUMINOUS BODY

LIGHT OBTAINED BY MIXING LIGHT EMITTED FROM FIRST LUMINOUS BODY AND LIGHT EMITTED FROM SECOND LUMINOUS BODY
VIOLET
BLUE
GREEN
YELLOW
RED
BLUE LIGHT
GREEN LIGHT
RED LIGHT
400
500
560
620
700
800

LIGHT EMITTED FROM SECOND LUMINOUS BODY
VIOLET
BLUE
GREEN
YELLOW
RED
ULTRAVIOLET LIGHT
GREEN LIGHT
RED LIGHT
SECOND LIGHT SOURCE: ULTRAVIOLET LED + GREEN PHOSPHOR + RED PHOSPHOR
SECOND SET WAVELENGTH OF SHORT WAVELENGTH CUT-OFF FILTER: ABOUT 510 nm
300
400
510
600
700
800

LIGHT OBTAINED BY MIXING LIGHT EMITTED FROM FIRST LUMINOUS BODY AND LIGHT EMITTED FROM SECOND LUMINOUS BODY

THIRD EMBODIMENT
LIGHT EMITTED FROM FIRST LUMINOUS BODY
VIOLET
BLUE
GREEN
YELLOW
RED
FIRST LIGHT SOURCE: ULTRAVIOLET LED +
BLUE PHOSPHOR
FIRST SET WAVELENGTH OF LONG
WAVELENGTH CUT-OFF FILTER: ABOUT 470 nm
ULTRAVIOLET
LIGHT
BLUE LIGHT
300
400
470
600
700
800

LIGHT EMITTING DEVICE, AND ILLUMINATION APPARATUS AND LUMINAIRE USING SAME

FIELD OF THE INVENTION

The present invention relates to a light emitting device that emits light, in which a specific range of wavelength is reduced, and an illumination apparatus and a luminaire using same.

BACKGROUND OF THE INVENTION

Conventionally, an illumination apparatus has been used in the areas such as shops in which a display effect is regarded as important. The illumination apparatus irradiates on a target object, light in which light in a specific wavelength range is reduced, thereby clearly displaying the target. In the illumination apparatus, for example, a band filter is attached to a light source in order to reduce the light in the specific wavelength range.

As an example of such a band filter, there is known a band filter that has a minimum light transmittance in a wavelength range of 500 to 600 nm (see, e.g., Japanese Patent Laid-open Publication No. 2001-66421 (JP2001-066421A)). This band filter has 40% to 95% of the light transmittance in the wavelength range of 500 nm to 600 nm, and 70% of the average light transmittance in the wavelength range of 400 nm to 500 nm and 600 nm to 700 nm adjacent to the above wavelength range.

The band filter aside, there is known a long wavelength cut-off filter which reduces the light having a wavelength longer than a specific wavelength and a short wavelength cut-off filter which reduces the light having a wavelength shorter than a specific wavelength, as an optical member for wavelength control. The long and short wavelength cut-off filter reduce light in a specific wavelength range more specifically than a general band filter. Further, they transmit light in a wavelength range rather than the specific wavelength range.

In the illumination apparatus disclosed in JP2001-66421A, light in a specific wavelength range is reduced by using the filter, but also reduced is light in a wavelength range adjacent to the specific wavelength range. Thus, a necessary light may be reduced, and a sufficient display effect may not be obtained.

SUMMARY OF THE INVENTION

In view of the above, the present invention provides a light emitting device capable of emitting light in which light in a specific wavelength range is reduced without substantially reducing light in a wavelength range adjacent to the specific wavelength range, and an illumination apparatus and a luminaire using the same.

In accordance with a first aspect of the present invention, there is provided a light emitting device including: a first luminous body that includes a first light source which emits light in a first wavelength range, and a long wavelength cut-off filter which cuts off light having a wavelength longer than a first set wavelength, the first wavelength range being set arbitrarily, the first set wavelength being set to a wavelength on a long wavelength side in the first wavelength range; and a second luminous body which generates light of different color from that of the first luminous body, and which includes a second light source that emits light in a second wavelength range, and a short wavelength cut-off filter that cuts off light having a wavelength shorter than a second set wavelength, the second wavelength range extending to a longer wavelength side than the first wavelength range while overlapping with the first wavelength range, the second set wavelength being set to a wavelength on a longer wavelength side than the first set wavelength in the second wavelength range, wherein light emitted from the first luminous body and light emitted from the second luminous body are mixed together, such that light in between the first set wavelength and the second set wavelength is reduced.

Each of the first light source and the second light source may include a solid state light emitting element, and a phosphor which wavelength-converts light emitted from the solid state light emitting element and emits the wavelength-converted light.

In the light emitting device, the first wavelength range may be a wavelength range of 420 to 650 nm, the second wavelength range may be a wavelength range of 420 to 800 nm, the first set wavelength of the long wavelength cut-off filter may be 560 nm, and the second set wavelength of the short wavelength cut-off filter may be 620 nm.

In the light emitting device, the first wavelength range may be a wavelength range of 300 to 550 nm, the second wavelength range may be a wavelength range of 300 to 800 nm, the first set wavelength of the long wavelength cut-off filter may be 480 nm, and the second set wavelength of the short wavelength cut-off filter may be 510 nm.

In the light emitting device, the first wavelength range may be a wavelength range of 300 to 550 nm, the second wavelength range may be a wavelength range of 300 to 800 nm, the first set wavelength of the long wavelength cut-off filter may be 470 nm, and the second set wavelength of the short wavelength cut-off filter may bes 500 nm.

In accordance with a second aspect of the present invention, there is provided an illumination apparatus using the above-described light emitting device.

In accordance with a third aspect of the present invention, there is provided a luminaire using the above-described light emitting device or the above-described illumination apparatus.

With the above configuration, the long wavelength cut-off filter cuts off light having a wavelength longer than a first set wavelength in the light emitted from the first light source. Further, the short wavelength cut-off filter cuts off light with a wavelength shorter than a second set wavelength which is set to a wavelength on the longer wavelength side of the second wavelength range than the first set wavelength in the light emitted from the second light source, the second wavelength range extending to the longer wavelength side than the first wavelength range while overlapping the first wavelength range. Therefore, it is possible to reduce the light in the specific wavelength range without significantly affecting light in a wavelength range adjacent to the specific wavelength range.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Figure 1:
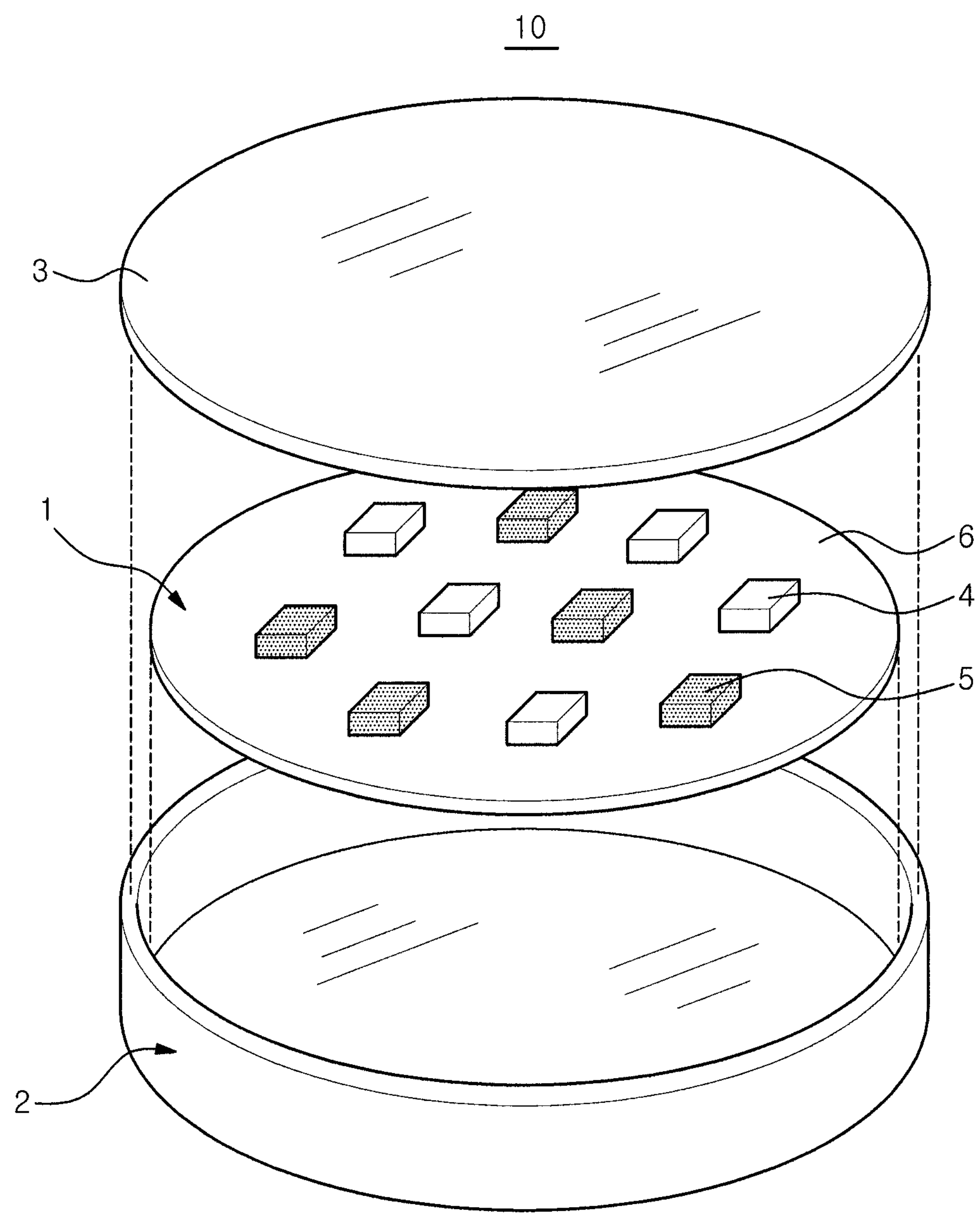
FIG. 1 shows an exploded perspective view of an illumination apparatus including a light emitting device in accordance with an embodiment of the present invention.

A light emitting device in accordance with an embodiment of the present invention and an illumination apparatus using the same will be described with reference to FIGS. 1 to 4. As shown in FIG. 1, an illumination apparatus 10 includes a light emitting device 1. The light emitting device 1 functions as a light source for the illumination apparatus 10. In the illumination apparatus 10, a housing 2 accommodates the light emitting device 1. A diffusion plate 3 is further provided to diffuse and emit the light generated from the light emitting device 1 to the outside.

The light emitting device 1 includes at least one first luminous body 4, at least one second luminous body 5, and a wiring board 6 for mounting the first luminous bodies 4 and the second luminous bodies 5 on one surface thereof. Hereinafter, the light emitting device which includes a plurality of first luminous bodies 4 and a plurality of second luminous bodies 5 will be described, but the present invention is not limited thereto. The light emitting device may include one first luminous body 4 or one second luminous body 5. The first luminous bodies 4 and the second luminous bodies 5 are uniformly arranged on one surface of the wiring board 6, respectively.

The wiring board 6 has a disc shape and includes a wiring pattern (not shown) electrically connected to each of the first luminous bodies 4 and the second luminous bodies 5. The wiring pattern is connected to an external drive circuit via a distribution line (both not shown). The drive circuit controls lighting of the first luminous bodies 4 and the second luminous bodies 5. The drive circuit is configured to individually control the lighting of the first luminous bodies 4 and the second luminous bodies 5.

Further, the surface of the wiring board 6, on which the first luminous bodies 4 and the second luminous bodies 5 are mounted thereon, is coated with a thin film material having a high light reflectance, e.g., silver or aluminum. The light diffused by the diffusion plate 3 and returned to the inside of the illumination apparatus 10 is reflected by the thin film towards the outside, thereby improving the light utilization efficiency of the illumination apparatus 10.

The housing 2 is formed in a cylindrical shape with a bottom. The light emitting device 1 is attached to the bottom surface on the inside of the housing 2. A holding member (not shown) is provided on the surface of the housing 2 opposite to the surface to which the light emitting device 1 is attached, and secures the housing 2 to the ceiling or a support. The housing 2 is fixed to a predetermined position through the holding member. The housing 2 is made of a material with excellent light reflectivity and heat dissipation, e.g., aluminum.

The diffusion plate 3 is formed in a disc shape having substantially the same diameter as that of the housing 2 and is attached to an upper end portion of the housing 2. The diffusion plate 3 is made of a material having a linear transmittance of 50% or less and diffuses lights emitted from the first luminous bodies 4 and the second luminous bodies 5 in various directions to mix the lights together. The diffusion plate 3 is formed of a transparent material such as transparent acrylic resin or transparent glass as a base material and includes a diffusion material therein to diffuse the light. The diffusion material is constituted by, e.g., granules (average particle size of 1 μm) made of an organic material such as fluorine-based resin or an inorganic material such as aluminum oxide or silica. Further, the diffusion plate 3 may have irregularities formed by frost processing on at least one of the front and rear surfaces thereof.

Figure 2:
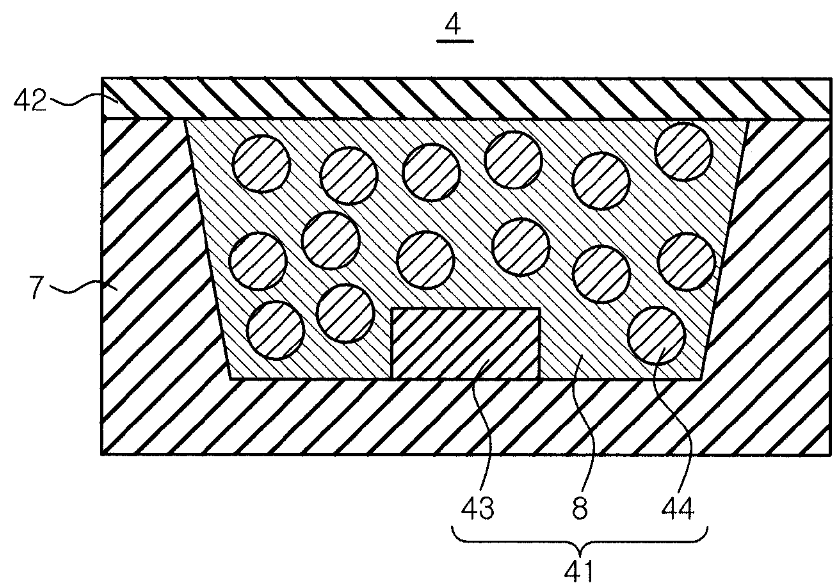
FIG. 2 illustrates a side cross-sectional view of a first luminous body of the light emitting device.

As shown in FIG. 2, the first luminous body 4 includes a first light source 41, which emits light in a first wavelength range that is set arbitrarily; a base 7, which accommodates the first light source 41; and a long wavelength cut-off filter 42, which is provided on the side on which the light from the first light source 41 is outputted. It is preferable that the first luminous body 4 emits visible light with a relatively short wavelength such as blue light or green light.

The first light source 41 includes a solid state light emitting element 43 (hereinafter, referred to as LED 43), a sealing material 8 sealing the LED 43, and a phosphor 44 which is dispersed in the sealing material 8 to wavelength convert light from the LED 43 and to emit the wavelength-converted light. The LED 43 is constituted by a desired LED, e.g., a blue LED that emits blue light or an ultraviolet LED that emits ultraviolet light.

The sealing material 8 is made of a transparent material that transmits light from the LED 43, e.g., transparent silicone resin, transparent epoxy resin, or transparent glass. The sealing material 8 preferably includes a diffusion material to diffuse the light. For example, the diffusion material is formed to be included in the diffusion plate 3.

The phosphor 44 is formed of a desired phosphor, e.g., a green phosphor that wavelength converts blue light from the blue LED into green light, or a blue phosphor that wavelength converts ultraviolet light from the ultraviolet LED into blue light. The phosphor 44 may be constituted by multiple types of phosphors, and these phosphors may be mixed together and dispersed in the sealing material 8.

The base 7 is formed in a shape having a central recess, and the LED 43 is disposed on the bottom surface thereof. A conductive path (not shown) serving as the electrical conduction to the LED 43 is provided on the bottom surface of the base 7. One end of the conductive path is connected to the LED 43, and the other end of the conductive path is derived to the outside of the base 7. The conductive path derived to the outside is connected to the wiring pattern of the wiring board 6.

A thin film, made of a material having a high light reflectivity, e.g., silver or aluminum, is provided on the inner surface of the base 7. This thin film reflects the light emitted laterally from the LED 43 or the light returned to the inside of the first luminous body 4 after being diffused in the phosphor 44 towards the outside to thereby enhance the light utilization efficiency of the first luminous body 4. The base 7 is made of a material with excellent thermal conductivity and heat resistance, e.g., aluminum or ceramic.

The long wavelength cut-off filter 42 is formed in a colorless transparent rectangular plate shape and is fixed to the upper end portion of the base 7 so as to face the first light source 41. The long wavelength cut-off filter cuts light having a wavelength longer than a specific wavelength in the light emitted from the first light source 41, to prevent the light with longer wavelength than a specific wavelength from being emitted to the outside. The long wavelength cut-off filter 42 includes an absorption type filter formed by dispersing a substance that absorbs light with a specific wavelength in a base material such as glass, ceramic, or resin, or a reflection type filter in which a metal thin film or dielectric thin film for reflecting light with a specific wavelength is laminated on the same base material.

Figure 3:
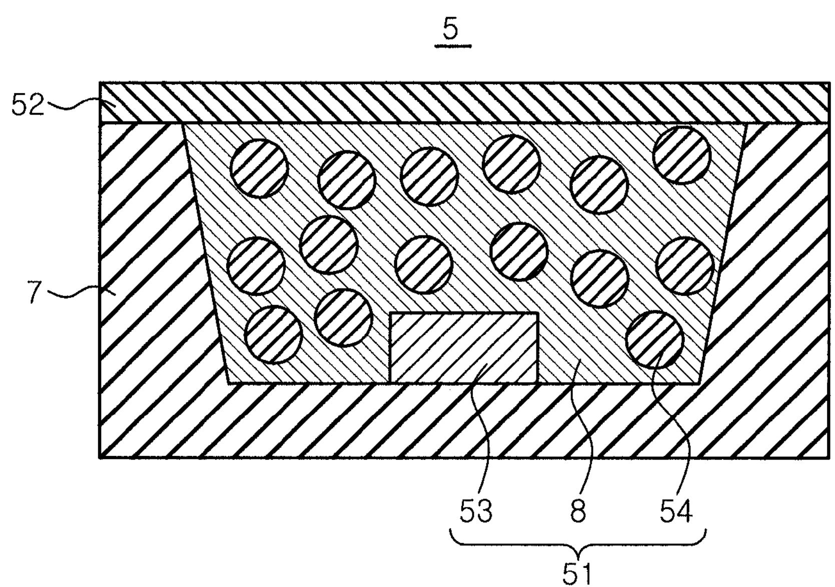
FIG. 3 depicts a side cross-sectional view of a second luminous body of the light emitting device.

As shown in FIG. 3, the second luminous bodies 5 are configured in the same manner as the first luminous bodies 4. Each of the second luminous bodies 5 includes a second light source 51. The second light source 51 emits light in a second wavelength range that extends to the longer wavelength side than the first wavelength range while overlapping with the first wavelength range. Each of the second luminous bodies 5 further includes the base 7 which accommodates the second light source 51, and a short wavelength cut-off filter 52 provided on the side to which the light from the second light source 51 is outputted. The second luminous body 5 generates light of a color different from the first luminous body 4. It is preferable that the second luminous body 5 emits visible light with a relatively long wavelength such as red light or yellow light.

The second light source 51 includes an LED 53 which is sealed by the sealing material 8 and a phosphor 54 which is dispersed in the sealing material 8. The phosphor 54 wavelength-converts light from the LED 33 and emits the wavelength-converted light. The LED 53 is configured in the same manner as the LED 43 included in the first light source 41. The phosphor 54 is formed of a desired phosphor, e.g., a red phosphor that wavelength-converts the light from the LED 53 into red light.

Figure 4A:
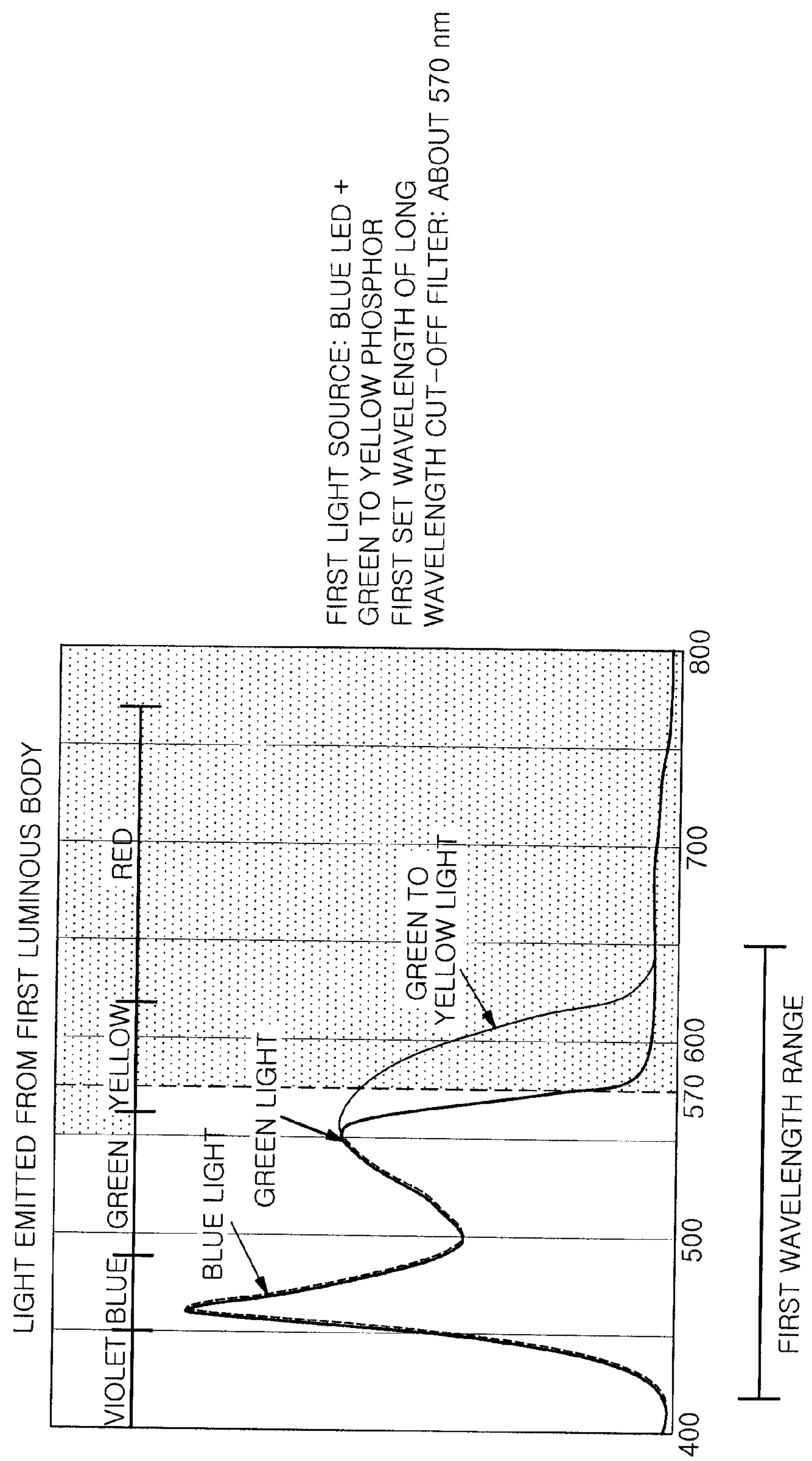
FIGS. 4A and 4B represent a spectrum example of the light emitted from the first luminous body and the second luminous body, respectively.

An example of the spectral characteristics of the light emitted from the first luminous bodies 4 and the second luminous bodies 5 configured as described above will be described with reference to FIG. 4A to 4C. As shown in FIG. 4A, the first light source 41 includes a blue LED as the LED 43 and a green to yellow phosphor which converts the blue light from the blue LED into green to yellow light as the phosphor 44. The first light source 41 emits light in the first wavelength range, i.e., about 420 to 650 nm. The long wavelength cut-off filter 42 cuts off light with a wavelength longer than a first set wavelength in the light emitted from the first light source 41. The first set wavelength is set to a wavelength on the longer wavelength side in the first wavelength range, e.g., about 570 nm.

The light emitted from the first light source 41 (spectrum is represented by a broken line) includes blue light from the blue LED and green to yellow light from the green to yellow phosphor. The long wavelength cut-off filter 42 cuts off the light in the longer wavelength range (area indicated by dots) than the wavelength of about 570 nm and reduces a portion of the yellow light in the light emitted from the first light source 41. Accordingly, the light emitted from the first luminous bodies 4 (spectrum is represented by a solid line) becomes light that mainly includes the blue light, the green light, and a portion of the yellow light.

Figure 4B:
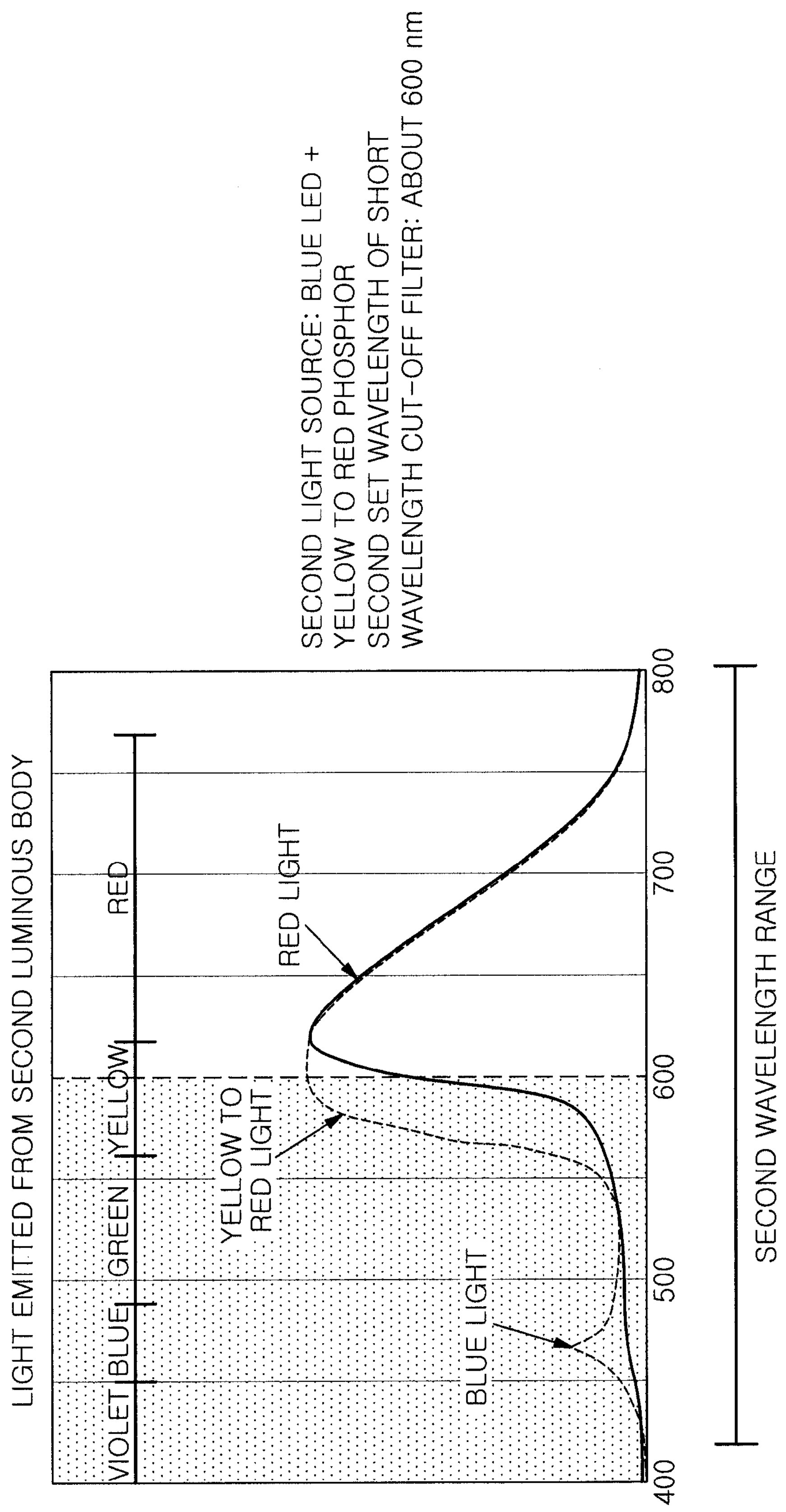

As shown in FIG. 4B, the second light source 51 includes a blue LED as the LED 53 and a yellow to red phosphor which converts the blue light from the blue LED into yellow to red light, as the phosphor 54. The second light source 51 emits light in the second wavelength range, i.e., about 420 to 800 nm. The short wavelength cut-off filter 52 cuts off light with a wavelength shorter than a second set wavelength in the light emitted from the second light source 51. The second set wavelength is set to a wavelength on the longer wavelength side in the second wavelength range, i.e., about 600 nm, the second set wavelength being longer than the first set wavelength.

The light emitted from the second light source 51 (spectrum is represented by a broken line) includes blue light from the blue LED and yellow to red light from the yellow to red phosphor. The short wavelength cut-off filter 52 cuts off the light in the shorter wavelength range (area indicated by dots) than the wavelength of about 600 nm and reduces the blue light and a portion of the yellow light in the light emitted from the second light source 51. Accordingly, the light emitted from the second luminous bodies 5 (spectrum is represented by a solid line) becomes light that mainly includes red light and a portion of the yellow light.

Figure 4C:
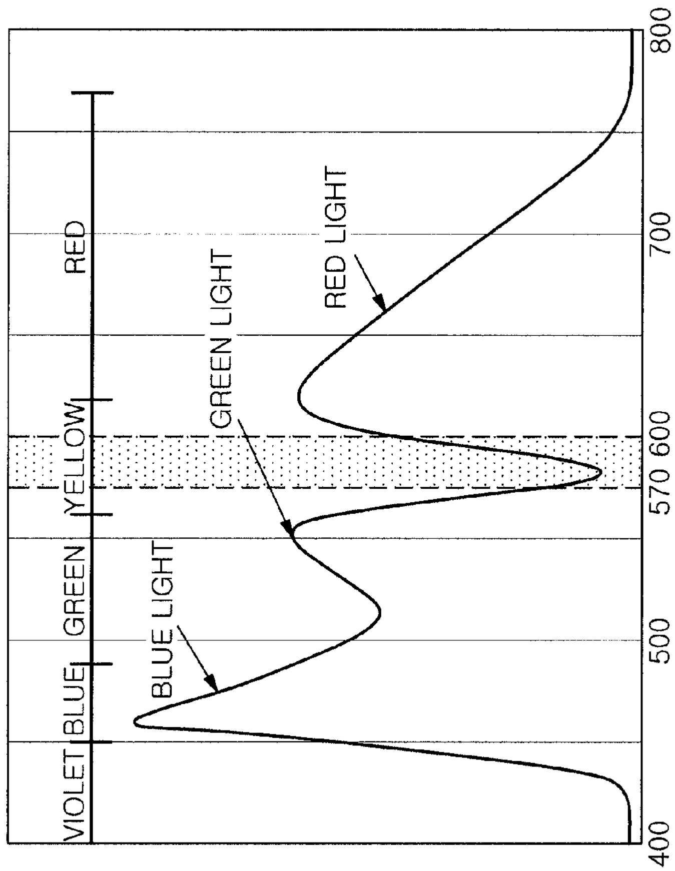
FIG. 4C shows the spectrum of light obtained by mixing the light emitted from the first luminous body as shown in FIG. 4A and the light emitted from the second luminous body as shown in FIG. 4B.

As shown in FIG. 4C, the light obtained by mixing the light emitted from the first luminous bodies 4 and the light emitted from the second luminous bodies 5 includes blue light and green light from the first luminous bodies 4 and red light from the second luminous bodies 5, which are mixed together to create white light. In this white light, a portion of the yellow light between the first set wavelength (about 570 nm) and the second set wavelength (about 600 nm) is specifically reduced. The reduction of the yellow light occurs significantly in the wavelength range of about 570 nm to 600 nm, and the light with a wavelength separated by 20 to 30 nm from this wavelength range is hardly reduced.

According to the illumination apparatus of this embodiment, instead of using a general band filter, the light in a specific wavelength range is reduced by combining the short wavelength cut-off filter 52 and the long wavelength cut-off filter 42. The light with the longer wavelength than the first set wavelength in the light emitted from the first light source 41 is cut off by the long wavelength cut-off filter 42. Further, the short wavelength cut-off filter 52 cuts off the light with the wavelength shorter than the second set wavelength set on the longer wavelength side than the first set wavelength in the light emitted from the second light source 51.

Herein, the second wavelength range extends to the longer wavelength side than the first wavelength range while overlapping the first wavelength range. Thus, it is possible to reduce the light in a specific wavelength range without significantly affecting the light in a wavelength range adjacent to the specific wavelength range. The wavelength range in which the light is reduced can be arbitrarily varied by changing the combination of the short wavelength cut-off filter 52 and the long wavelength cut-off filter 42.

(First Embodiment)

Figure 5A:
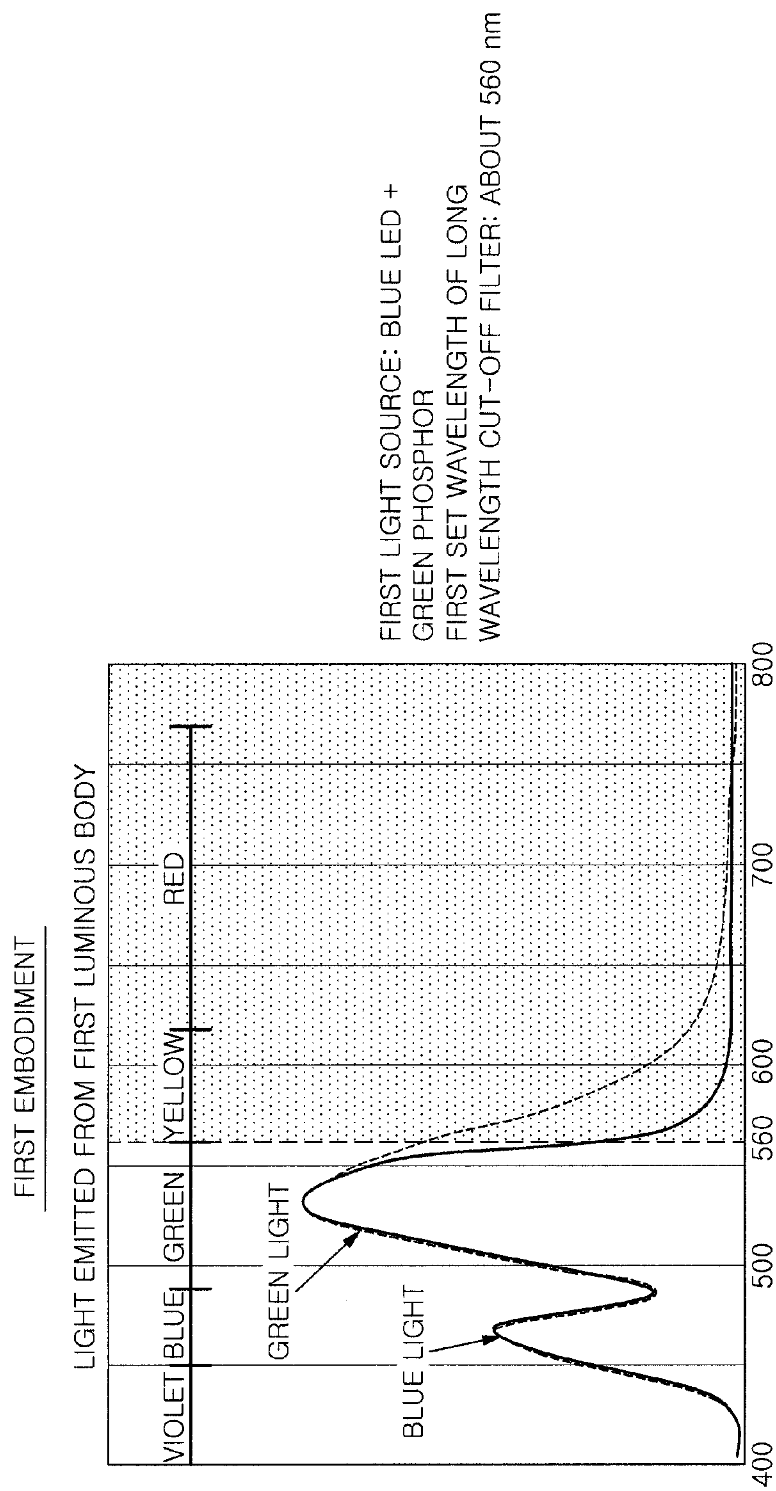
FIGS. 5A and 5B illustrate the spectrum of the light emitted from the first luminous body and the second luminous body in a first embodiment, respectively.

Next, an illumination apparatus in accordance with a first embodiment of the present invention will be described with reference to FIG. 5A to 5C. As shown in FIG. 5A, the first light source 41 includes a blue LED as the LED 43 and a green phosphor which mainly converts the blue light from the blue LED into green light as the phosphor 44. The first set wavelength of the long wavelength cut-off filter 42 is about 560 nm.

The first light source 41 emits light in the first wavelength range of about 420 to 650 nm (spectrum is represented by a broken line), including the blue light from the blue LED, and the green light with a bit of the yellow light from the green phosphor. The long wavelength cut-off filter 42 cuts off the light in the longer wavelength area (area indicated by dots) than the wavelength of about 560 nm and reduces the yellow light in the light emitted from the first light source 41. Accordingly, the light emitted from the first luminous bodies 4 (spectrum is represented by a solid line) becomes light that mainly includes the blue light and the green light.

Figure 5B:
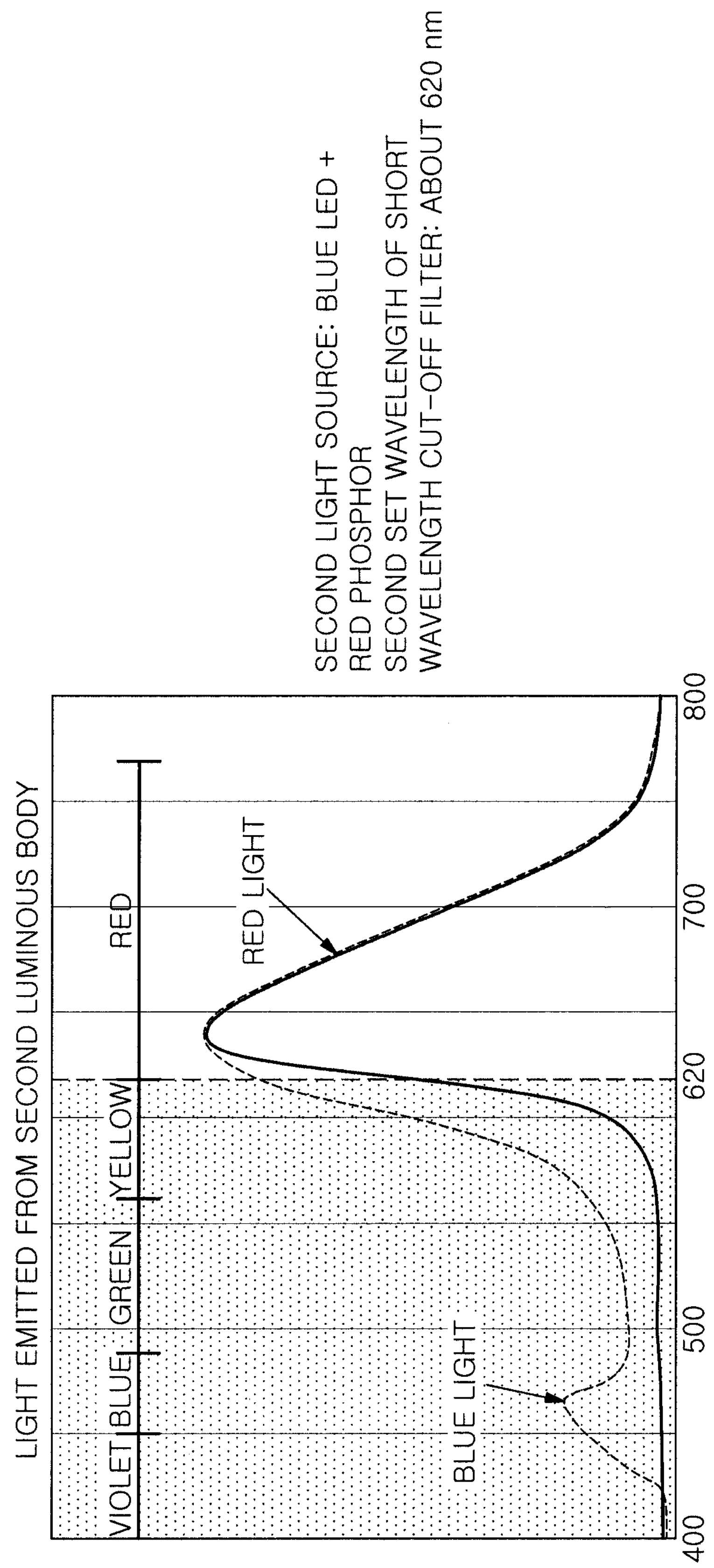

As shown FIG. 5B, the second light source 51 includes a blue LED as the LED 53 and a red phosphor which mainly converts the blue light from the blue LED into red light as the phosphor 54. The second set wavelength of the short wavelength cut-off filter 52 is about 620 nm. The second light source 51 emits the light in the second wavelength range of about 420 to 800 nm (spectrum is represented by a broken line), including the blue light from the blue LED, and the red light with a bit of the yellow light from the red phosphor.

The short wavelength cut-off filter 52 cuts off the light in the shorter wavelength area (area indicated by dots) than the wavelength of about 620 nm and reduces the blue light and the yellow light in the light emitted from the second light source 51. Accordingly, the light emitted from the second luminous bodies 5 (spectrum is represented by a solid line) becomes light that mainly includes the red light.

Figure 5C:
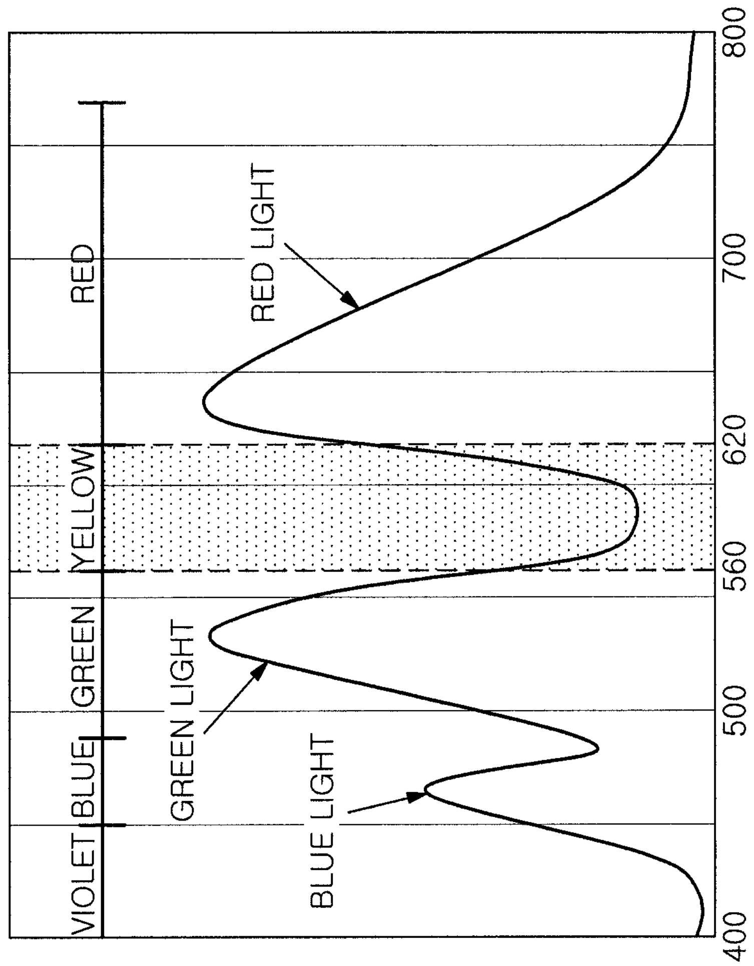
FIG. 5C shows the spectrum of light obtained by mixing the light emitted from the first luminous body as shown in FIG. 5A and the light emitted from the second luminous body as shown in FIG. 5B.

As shown FIG. 5C, the light obtained by mixing the light emitted from the first luminous bodies 4 and the light emitted from the second luminous bodies 5 includes the blue light and the green light from the first luminous bodies 4 and the red light from the second luminous bodies 5, which are mixed together to create a white color of light. In this white light, the yellow light having a wavelength ranging from about 560 to about 620 nm is specifically reduced.

Figure 6:
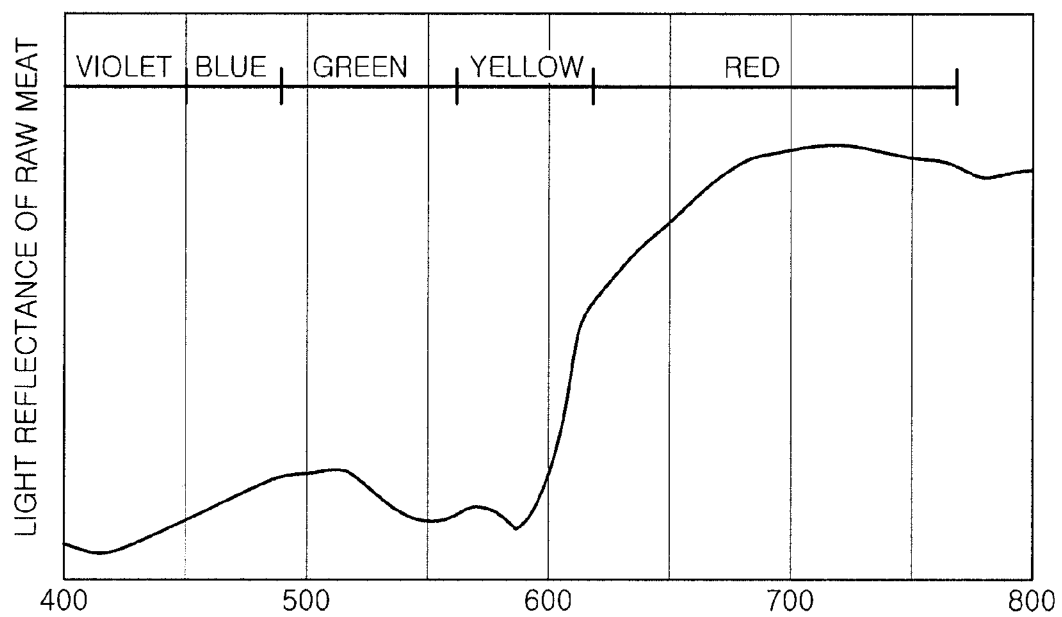
FIG. 6 shows the spectral reflectance of raw meat.

According to the illumination apparatus of the present embodiment, it is possible to irradiate a white light which includes red light and reduced yellow light. FIG. 6 shows light reflectance of raw meat. As shown in FIG. 6, the raw meat efficiently reflects red light. From this, it is known that raw meat looks vivid and shiny when the raw meat is illuminated with light including the red light. In addition, it is known that raw meat looks dull when the raw meat is illuminated with the yellow light. Therefore, the illumination apparatus of this embodiment can be suitably used to illuminate raw meat in a butcher shop, supermarket, or the like.

(Second Embodiment)

Figure 7A:
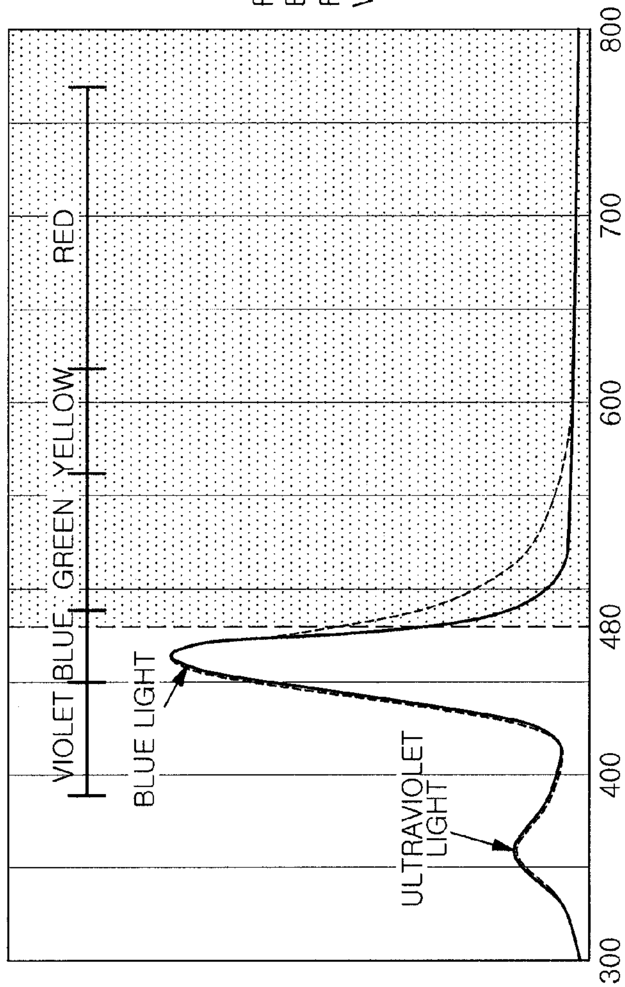
FIGS. 7A and 7B depict the spectrum of the light emitted from the first luminous body and the second luminous body in a second embodiment, respectively.

Next, an illumination apparatus in accordance with a second embodiment of the present invention will be described with reference to FIG. 7A to 7C. Referring to FIG. 7A, the first light source 41 includes an ultraviolet LED as the LED 43 and a blue phosphor which converts the ultraviolet light from the ultraviolet LED into blue light as the phosphor 44. The first set wavelength of the long wavelength cut-off filter 42 is about 480 nm. The first light source 41 emits light (spectrum is represented by a broken line) in a first wavelength range of about 300 to 550 nm, including an ultraviolet light from the ultraviolet LED, and blue light with a bit of green light from the blue phosphor.

The long wavelength cut-off filter 42 cuts off the light in the longer wavelength range (area indicated by dots) than the wavelength of about 480 nm and reduces the green light in the light emitted from the first light source 41. Accordingly, the light emitted from the first luminous bodies 4 (spectrum is represented by a solid line) becomes light that mainly includes the ultraviolet light and the blue light.

Figure 7B:
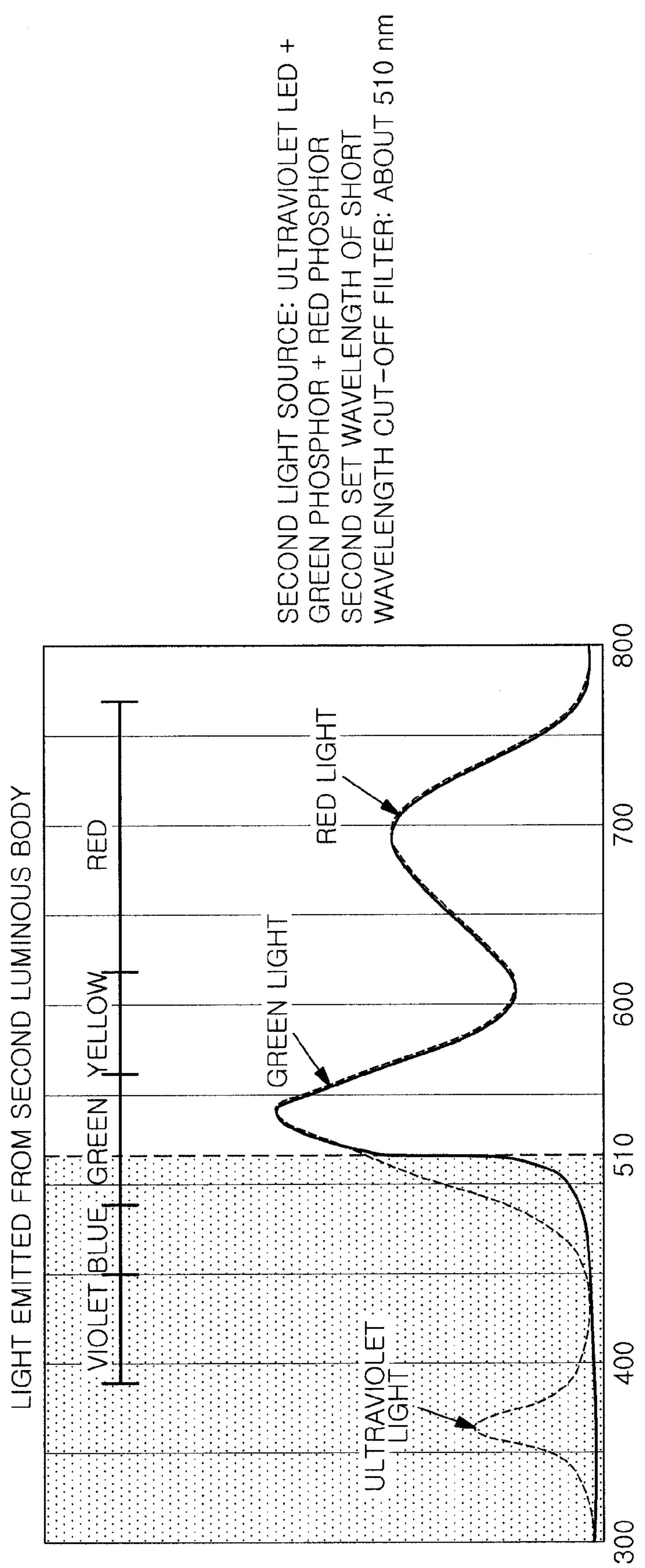

As shown in FIG. 7B, the second light source 51 includes an ultraviolet LED as the LED 53, and a green phosphor which converts the ultraviolet light from ultraviolet LED into green light and a red phosphor which converts the ultraviolet light into red light, as the phosphor 54. The second set wavelength of the short wavelength cut-off filter 52 is about 510 nm. The second light source 51 emits light (spectrum is represented by a broken line) in a second wavelength range of about 300 to 800 nm, including the ultraviolet light from the ultraviolet LED, the green light with a bit of blue light from the green phosphor, and the red light from the red phosphor.

The short wavelength cut-off filter 52 cuts off the light in the shorter wavelength range (area indicated by dots) than the wavelength of about 510 nm and reduces the ultraviolet light, the blue light, and a portion of the green light in the light emitted from the second light source 51. Accordingly, the light emitted from the second luminous bodies 5 (spectrum is represented by a solid line) becomes light that mainly includes green light and red light.

Figure 7C:
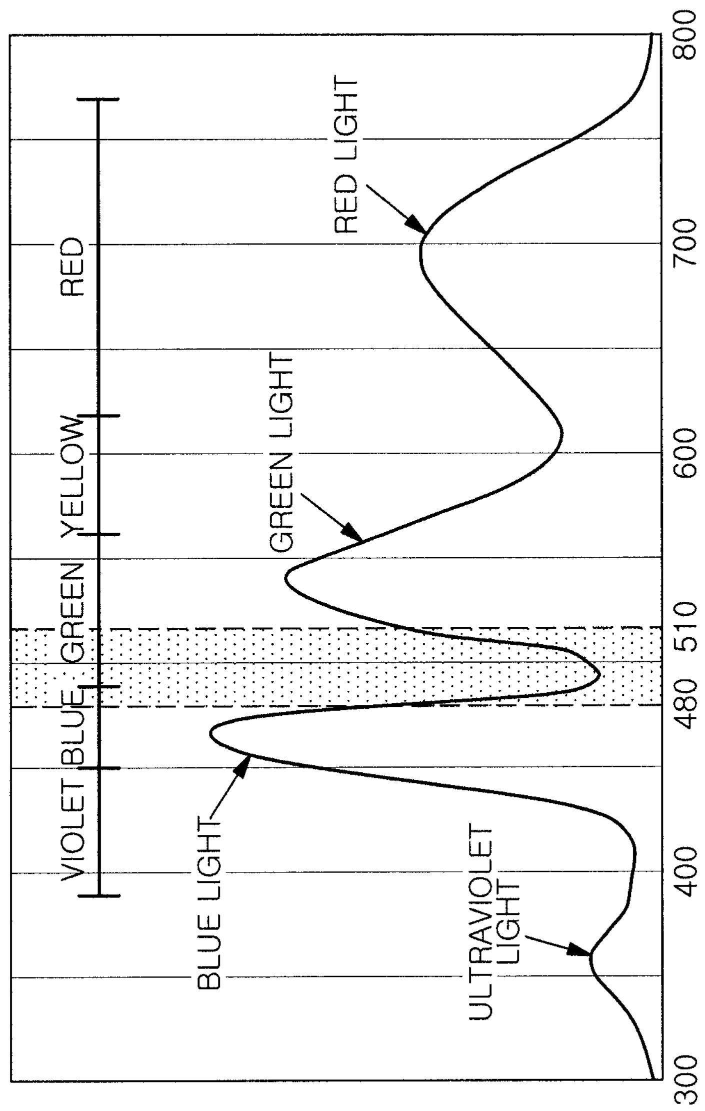
FIG. 7C shows the spectrum of light obtained by mixing the light emitted from the first luminous body as shown in FIG. 7A and the light emitted from the second luminous body as shown in FIG. 7B.

As shown in FIG. 7C, the light obtained by mixing the light emitted from the first luminous bodies 4 and the light emitted from the second luminous bodies 5 includes the ultraviolet light and the blue light from the first luminous bodies 4, and the green light and the red light from the second luminous bodies 5, which are mixed together to create white light. In this white light, the blue-green light having a wavelength ranging from about 480 to about 510 nm is specifically reduced.

According to the illumination apparatus of this embodiment, it is possible to irradiate the white light in which the blue-green light is reduced. Accordingly, it is possible to clarify the contrast between blue and green of a subject to be irradiated while illuminating the subject with natural light. For example, this illumination apparatus can be used as an indoor illumination apparatus. Further, in order to prevent the ultraviolet light from the first luminous bodies 4 from leaking to the outside of the illumination apparatus, an ultraviolet light filter for cutting off the ultraviolet light may be separately provided on the surface of the diffusion plate 3 or the like. Alternatively, a glove containing an ultraviolet absorber may be attached to the illumination apparatus. Accordingly, it is possible to emit illumination light suitable for a general indoor illumination.

(Third Embodiment)

Figure 8A:
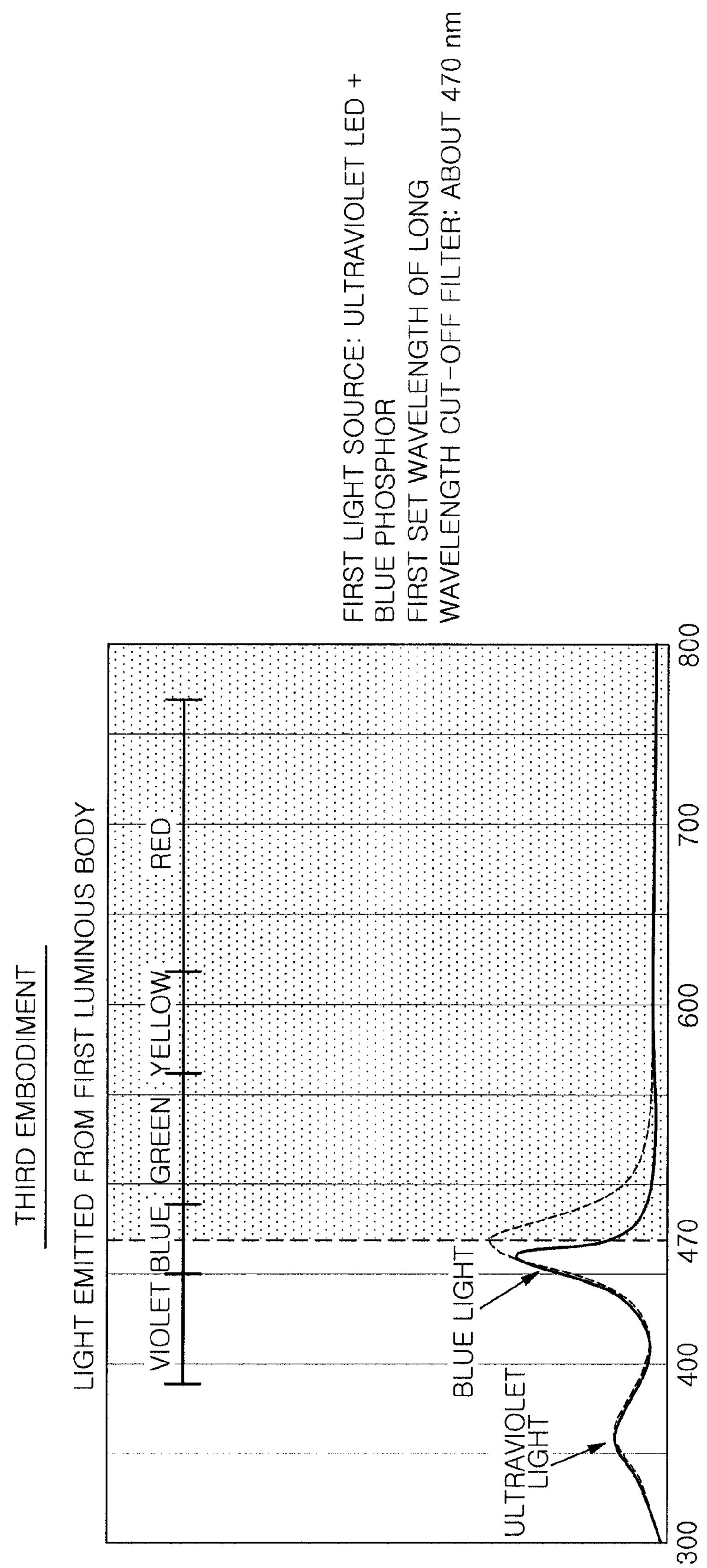
FIGS. 8A and 8B present the spectrum of the light emitted from the first luminous body and the second luminous body in a third embodiment, respectively.

Next, an illumination apparatus in accordance with a third embodiment of the present invention will be described with reference to FIG. 8A to 8C. In this embodiment, as shown FIG. 8A, the first light source 41 includes an ultraviolet LED as the LED 43 and a blue phosphor which converts the ultraviolet light from the ultraviolet LED into blue light as the phosphor 44. The first set wavelength of the long wavelength cut-off filter 42 is about 470 nm.

The first light source 41 emits light (spectrum is represented by a broken line) in a first wavelength range of about 300 to 550 nm, including the ultraviolet light from the ultraviolet LED and the blue light with a bit of green light from the blue phosphor. The long wavelength cut-off filter 42 cuts off the light in the longer wavelength range (area indicated by dots) than the wavelength of about 470 nm and reduces the green light and a portion of the blue light in the light emitted from the first light source 41. Accordingly, the light emitted from the first luminous bodies 4 (spectrum is represented by a solid line) becomes light that mainly includes ultraviolet light and blue light.

Figure 8B:
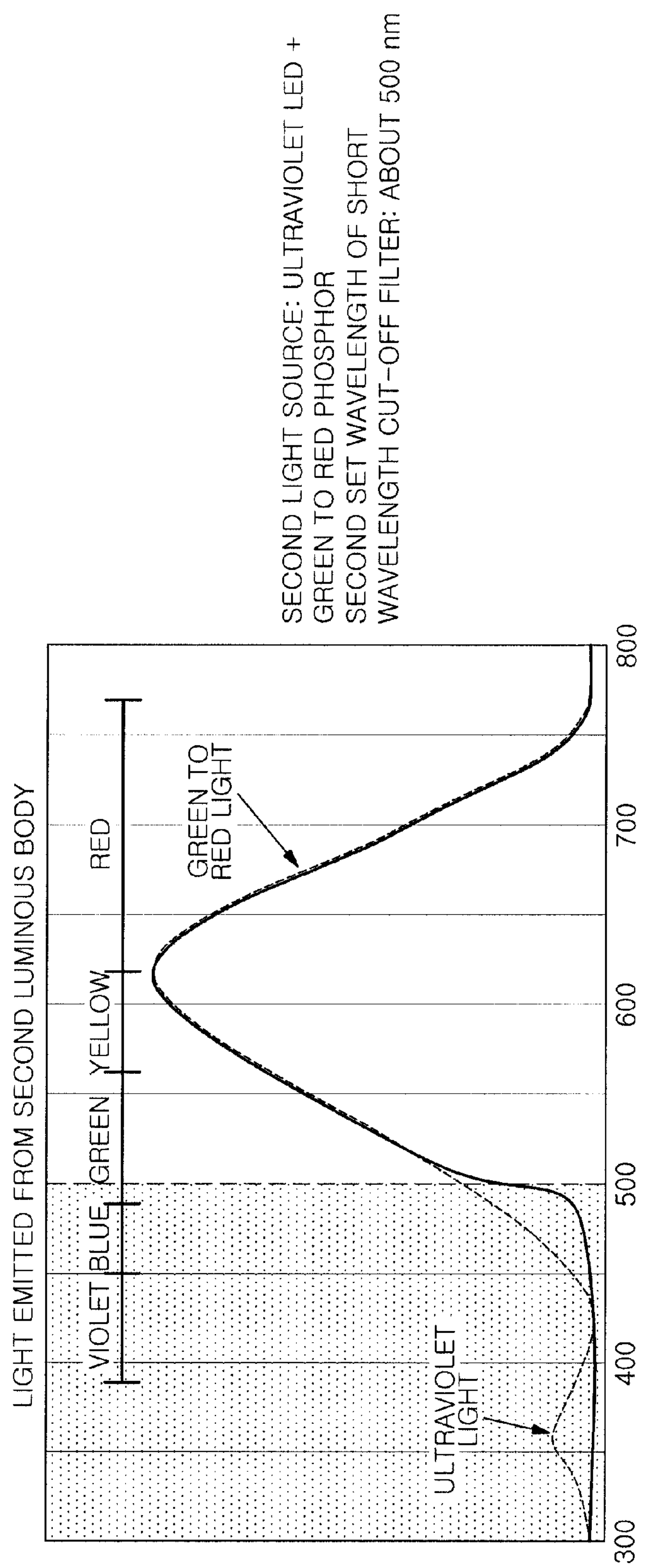

As shown in FIG. 8B, the second light source 51 includes an ultraviolet LED as the LED 53 and a blue to red phosphor which converts the ultraviolet light from ultraviolet LED into blue to red light as the phosphor 54. The second set wavelength of the short wavelength cut-off filter 52 is about 500 nm. The second light source 51 emits light (spectrum is represented by a broken line) in a second wavelength range of about 300 to 800 nm, the light including ultraviolet light from the ultraviolet LED and the blue to red light from the blue to red phosphor.

The short wavelength cut-off filter 52 cuts off the light in the shorter wavelength range (area indicated by dots) than the wavelength of about 500 nm and reduces the ultraviolet light, the blue light, and a portion of the green light in the light emitted from the second light source 51. Accordingly, the light emitted from the second luminous bodies 5 (spectrum is represented by a solid line) mainly becomes light that mainly includes the green to red light.

For example, in the case of the bulb-color light emission, the emission intensity of each of the first luminous bodies 4 and the second luminous bodies 5 may be adjusted such that the energy of the green to red light becomes approximately 1.7 times or more than the energy of the blue light emitted from the first luminous bodies 4.

Figure 8C:
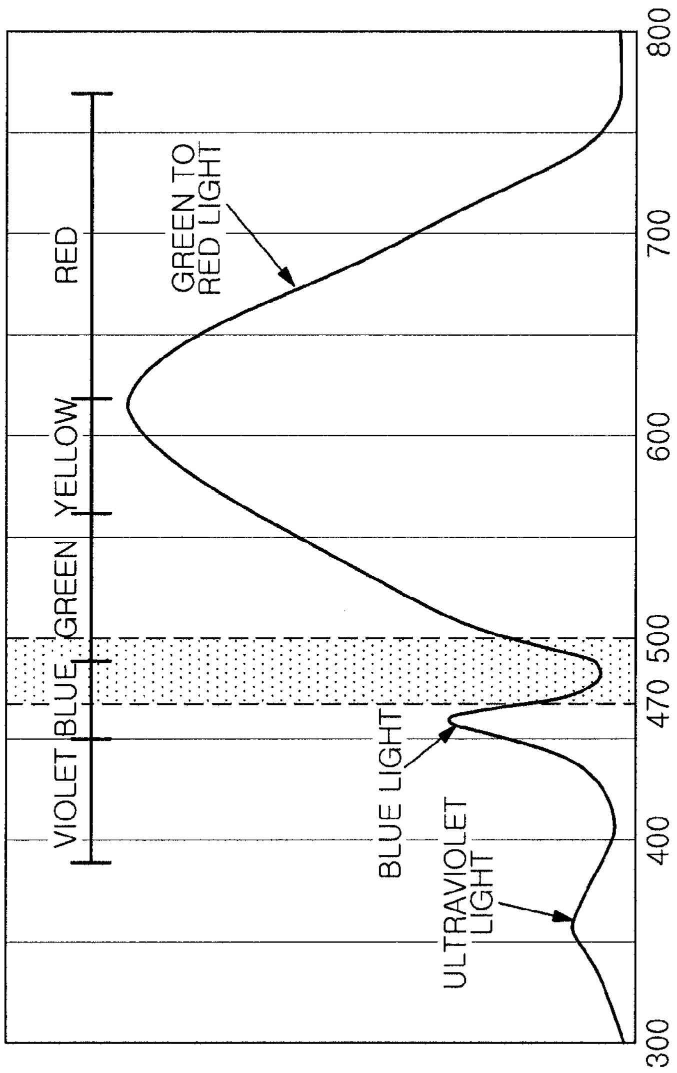
FIG. 8C shows the spectrum of light obtained by mixing the light emitted from the first luminous body as shown in FIG. 8A and the light emitted from the second luminous body as shown in FIG. 8B.

As shown in FIG. 8C, the light obtained by mixing the light emitted from the first luminous bodies 4 and the light emitted from the second luminous bodies 5 includes the ultraviolet light and the blue light from the first luminous bodies 4 and the green to red light from the second luminous bodies 5, which are mixed together to create a white color of light. Since the energy of the green to red light is higher than that of the blue light, the white light becomes a white light with a warm bulb color. In this white light, the blue-green light having a wavelength ranging from about 470 to about 500 nm is specifically reduced.

Figure 9:
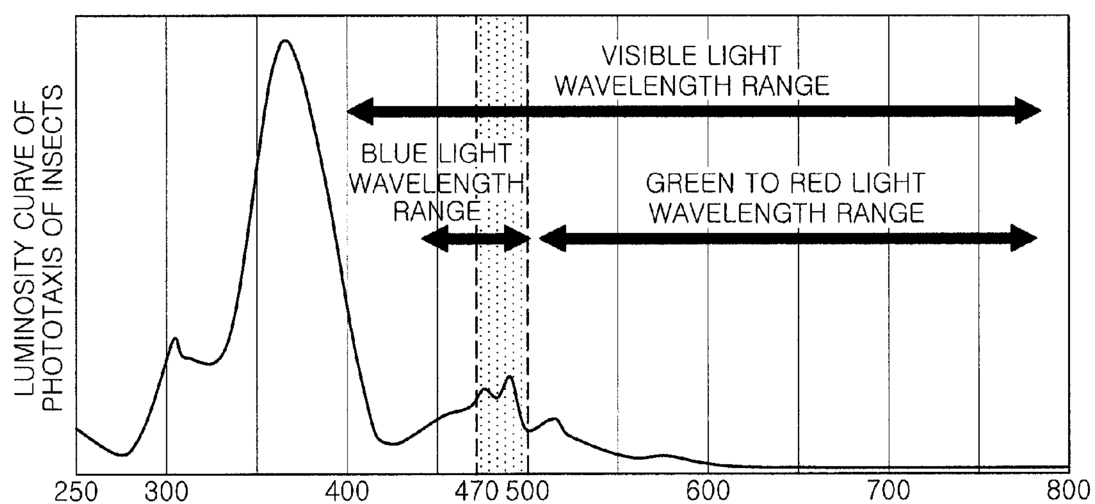
FIG. 9 shows a luminosity curve of phototaxis of insects.

According to the illumination apparatus of this embodiment, it is possible to irradiate the white light in which the blue-green light in the wavelength range of about 470-500 nm is reduced and in which the green to red light components are rich compared to the blue light components. FIG. 9 shows the luminosity curve of phototaxis of insects. As shown in FIG. 9, it is known that the blue-green light in the wavelength range of about 470-500 nm (area indicated by dots) has a relatively high insect phototaxis in the wavelength range of visible light. Further, it is known that light in a blue light wavelength range has a higher insect phototaxis than the light in a green to red light wavelength range. Accordingly, by using the illumination apparatus of this embodiment, it is possible to irradiate the white light that repels insects. For example, this illumination apparatus may be used indoors, or provided in the field for growing plants.

(Fourth Embodiment)

Figure 10A:
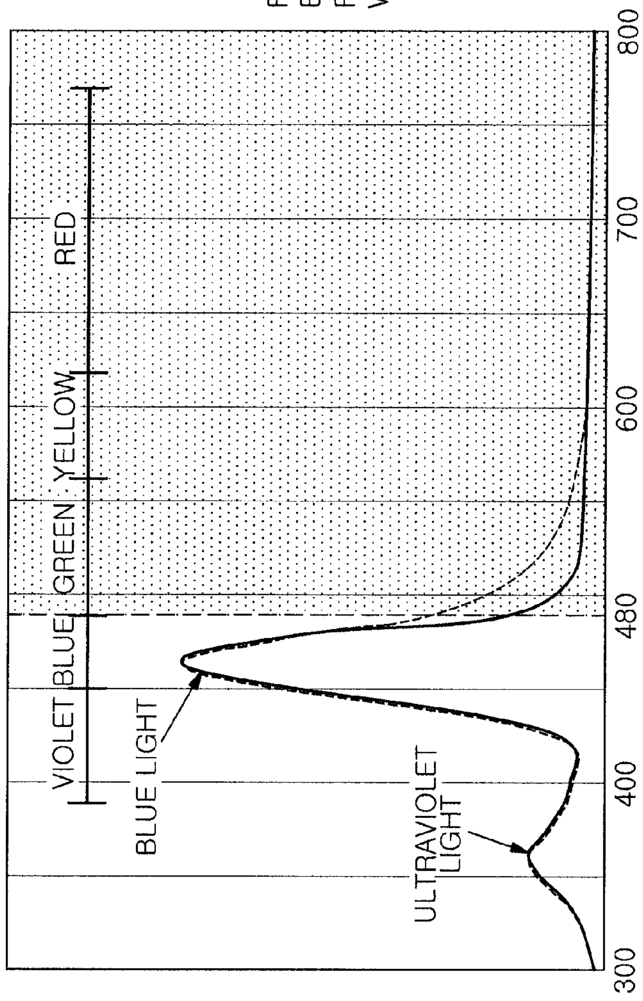
FIGS. 10A and 10B illustrate the spectrum of the light emitted from the first luminous body and the second luminous body in a fourth embodiment, respectively.

Next, an illumination apparatus in accordance with a fourth embodiment of the present invention will be described with reference to FIG. 10A to 10C. In this embodiment, as shown in FIG. 10A, the first light source 41 includes an ultraviolet LED as the LED 43 and a blue phosphor which converts the ultraviolet light from the ultraviolet LED into blue light as the phosphor 44. The first set wavelength of the long wavelength cut-off filter 42 is about 490 nm.

The first light source 41 emits light (spectrum is represented by a broken line) in a first wavelength range of about 300 to 600 nm, the light including the ultraviolet light from the ultraviolet LED and the blue light with a bit of green light from the blue phosphor. The long wavelength cut-off filter 42 cuts off the light in the longer wavelength range (area indicated by dots) than the wavelength of about 490 nm and reduces the green light in the light emitted from the first light source 41. Accordingly, the light emitted from the first luminous bodies 4 (spectrum is represented by a solid line) becomes light that mainly includes ultraviolet light and blue light.

Figure 10B:
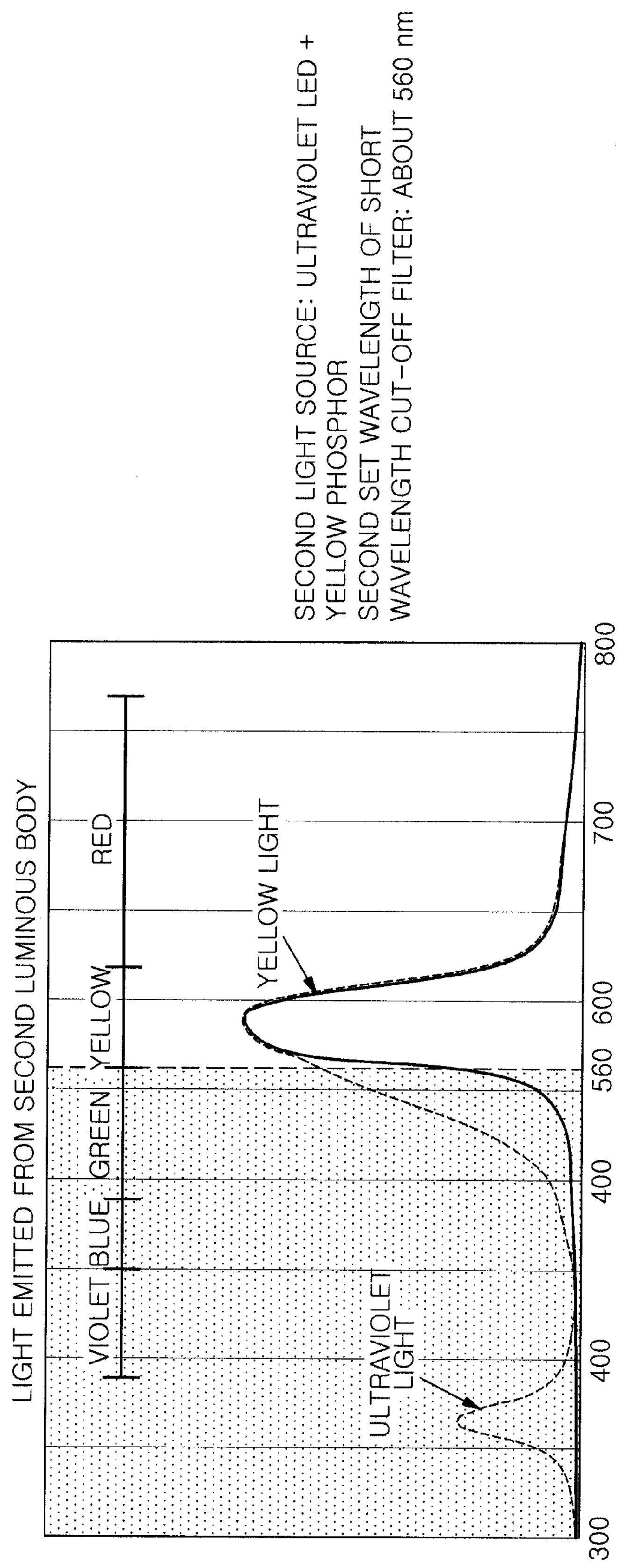

As shown in FIG. 10B, the second light source 51 includes an ultraviolet LED as the LED 53 and a yellow phosphor which converts the ultraviolet light from the ultraviolet LED into a yellow light as the phosphor 54. The second set wavelength of the short wavelength cut-off filter 52 is about 560 nm. The second light source 51 emits light (spectrum is represented by a broken line) in a second wavelength range of about 300 to 700 nm, the light including the ultraviolet light from the ultraviolet LED, and the yellow light with a bit of green light from the yellow phosphor.

The short wavelength cut-off filter 52 cuts off the light in the shorter wavelength range (area indicated by dots) than the wavelength of about 560 nm and reduces the ultraviolet light and the green light in the light emitted from the second light source 51. Accordingly, the light emitted from the second luminous bodies 5 (spectrum is represented by a solid line) mainly includes the yellow light.

Figure 10C:
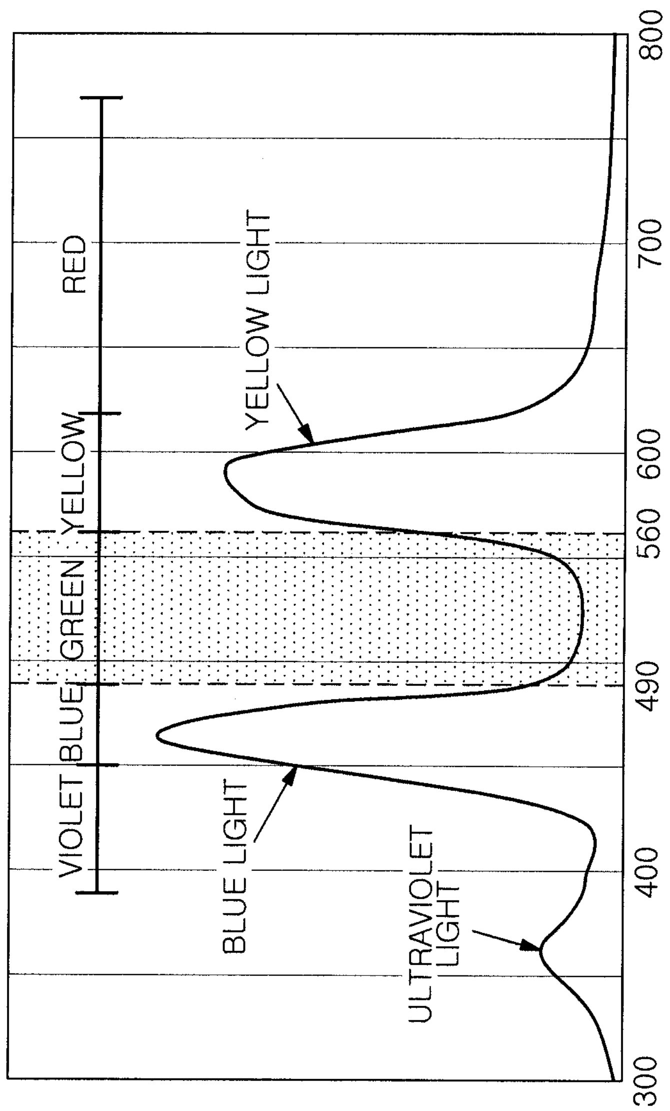
FIG. 10C shows the spectrum of light obtained by mixing the light emitted from the first luminous body as shown in FIG. 10A and the light emitted from the second luminous body as shown in FIG. 10B.

As shown in FIG. 10C, the light obtained by mixing the light emitted from the first luminous bodies 4 and the light emitted from the second luminous bodies 5 includes the ultraviolet light and the blue light from the first luminous bodies 4, and the yellow light from the second luminous bodies 5, which are mixed together to create a white color of light. In this white light, the green light having a wavelength ranging from about 490 to about 560 nm is specifically reduced. Further, the first light source 41 is configured to be controlled separately from the second light source 51.

According to the illumination apparatus of this embodiment, lighting of the first light source 41 and the second light source 51 can be controlled separately. Thus, it is possible to vary the color temperature of the white light by mixing the blue light from the first luminous bodies 4 and the yellow light from the second luminous bodies 5 at an arbitrary ratio.

Generally, the blue light looks dark in a bright place and, in contrast, looks vivid in a dark place (Purkyne phenomenon). Therefore, if the illumination apparatus of this embodiment is used as a street lamp, for example, it is possible to improve the visibility of the irradiated subject even in the time period in which sunshine is reduced, by setting to increase blue light as the sunshine decreases.

Further, the light emitting device according to the present invention may be modified in various ways without being limited to the embodiments and examples described above. For example, each of the first light source and the second light source need not necessarily have a phosphor and may be configured to directly emit the light from the LED (solid state light emitting element). Further, each of the first light source and the second light source may have, e.g., an organic electroluminescent (EL) device or a color fluorescent lamp, other than the LED, as a light emitter. In addition, the long and short wavelength cut-off filter need not necessarily be colorless or may be colored.

In the forgoing embodiments, a case where the light emitting device 1 according to the present invention is incorporated into the illumination apparatus as shown in FIG. 1 and lighting of the light emitting device is controlled by the drive circuit has been described. However, the present invention is not limited thereto, and it may be applied to an illumination apparatus such as an LED bulb, a lamp unit, and a power supply circuit built-in LED unit. Hereinafter, examples of an illumination apparatus and a luminaire using the light emitting device in accordance with the present invention will be described with reference to FIGS. 11A to 12B.

Figure 11A:
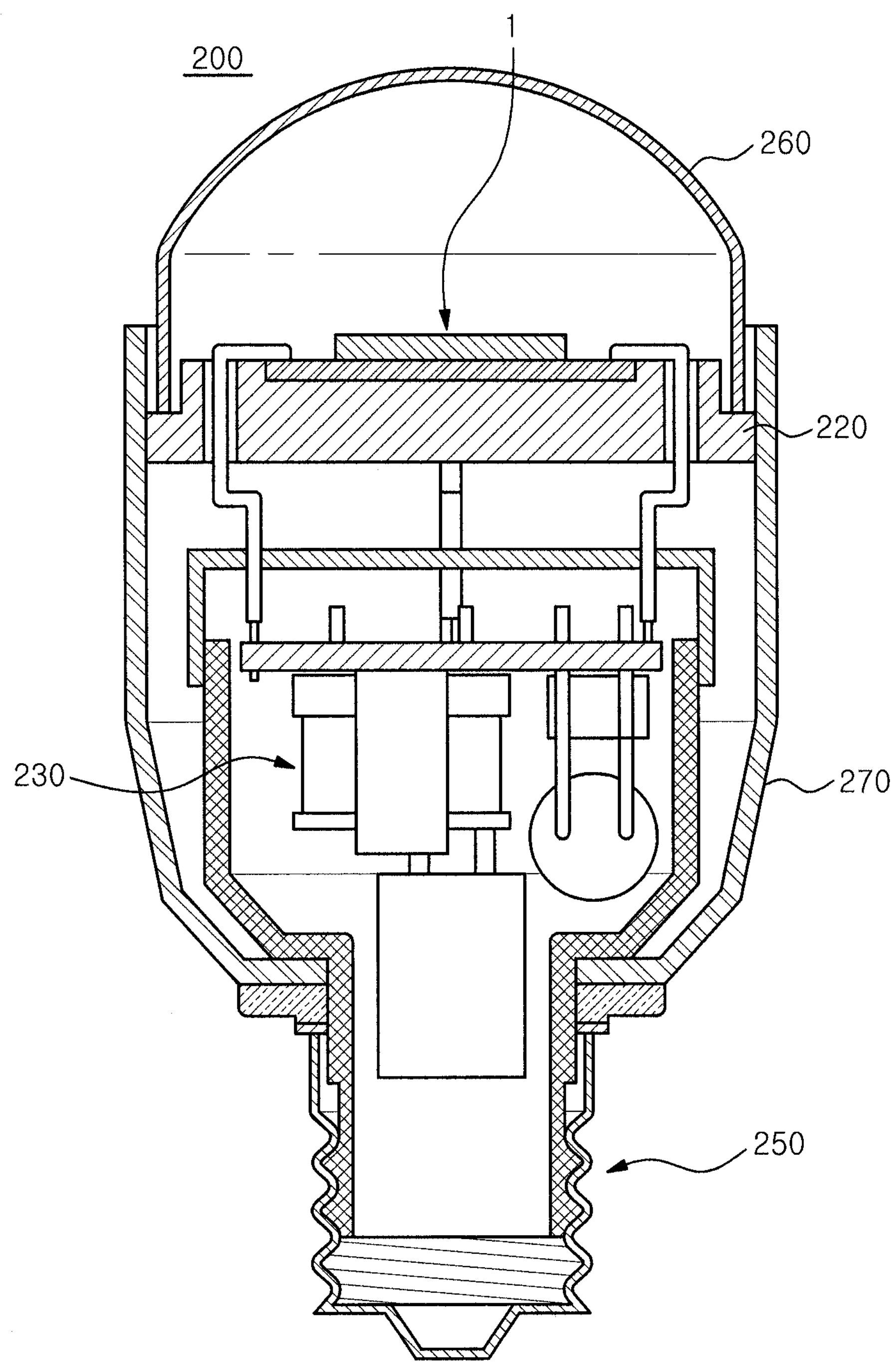
FIGS. 11A and 11B represent other examples of the illumination apparatus capable of using the light emitting device in accordance with the embodiment of the present invention.

FIG. 11A illustrates an LED bulb 200 as an example of an illumination apparatus. As shown in FIG. 11A, the light emitting device 1 is mounted on a holder 220. The holder 220 is made of a high thermal conductive material, e.g., aluminium, so that heat from the light emitting device 1 can be dissipated to a housing 270 with high efficiency. The drive circuit is built into a power supply unit 230. A glove 260 covers the light emitting device 1. Further, the glove 260 is formed in a substantially dome shape to cover the light emitting device 1, and an open end thereof is fixed to the housing 270 and the holder 220 by an adhesive.

The housing 270 is formed in, e.g., a cylindrical shape. The light emitting device 1 is disposed at one end portion of the housing 270, and a screw cap 250 is disposed on the other end portion of the housing 270. In order to function as a heat dissipating member (heat sink) to dissipate heat from the light emitting device 1, the housing 270 is also formed of a material with good thermal conductivity, e.g., aluminum.

With the illumination apparatus shown in FIG. 11A, it is possible to achieve compatibility with an incandescent lamp since the LED bulb 200 is easily installed into a socket made for the incandescent lamp with the screw cap 250, in addition to the effects of the present invention.

Figure 11B:
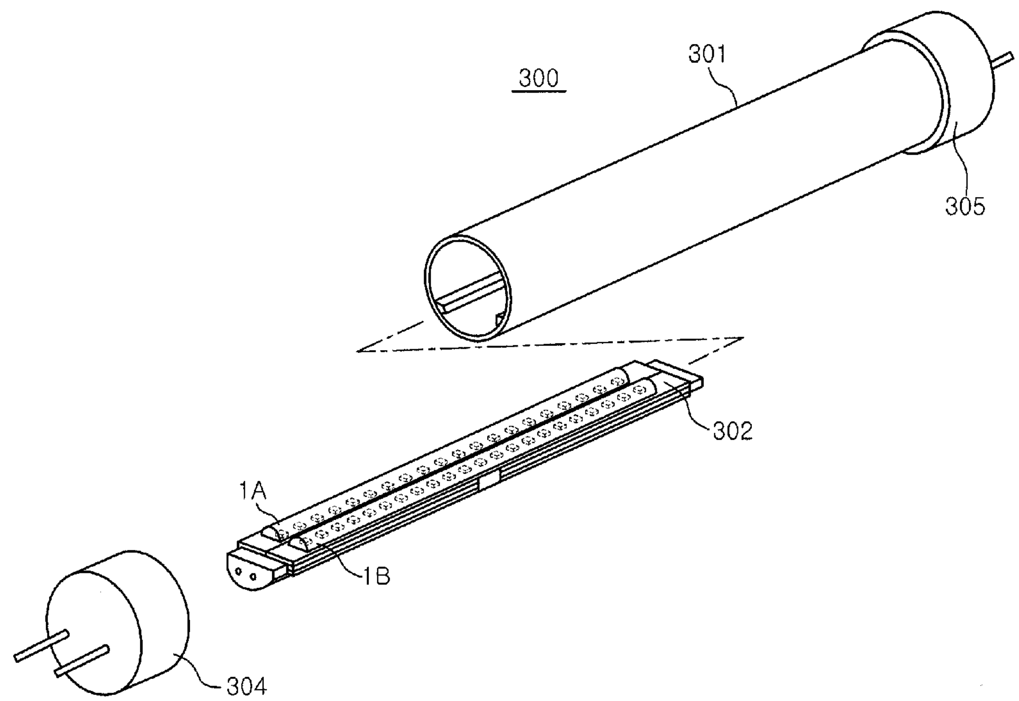

FIG. 11B illustrates an illumination apparatus 300 in which multiple light emitting devices according to the present invention is used. As shown in FIG. 11B, the illumination apparatus 300 includes two light emitting devices 1A and 1B. The illumination apparatus 300 includes an elongated tubular housing 301, a base 302 disposed in the housing 301, and a pair of caps 304 and 305 attached to both ends of the housing 301. The light emitting devices 1A and 1B are mounted on the base 302.

The housing 301 has an elongated tubular shape having openings at both ends, and accommodates the base 302 and the light emitting devices 1A and 1B. The material of the housing 301 is not particularly limited, but it is preferably a light transmitting material. As the light transmitting material, for example, resin such as plastic, glass, or the like may be used. Further, the cross-sectional shape of the housing 301 is not particularly limited, and may be a circular ring shape or polygonal ring shape. The base 302 preferably functions as a heat sink for dissipating the heat from the light emitting devices 1A and 1B. To this end, the base 302 is preferably formed of a material with high thermal conductivity such as metal.

Since the illumination apparatus 300 shown in FIG. 11B is easily installed into a socket made for a straight tubular florescent lamp with the caps 304 and 305, it is possible to ensure compatibility with the straight tubular florescent lamp, in addition to the effects of the present invention.

Figure 12A:
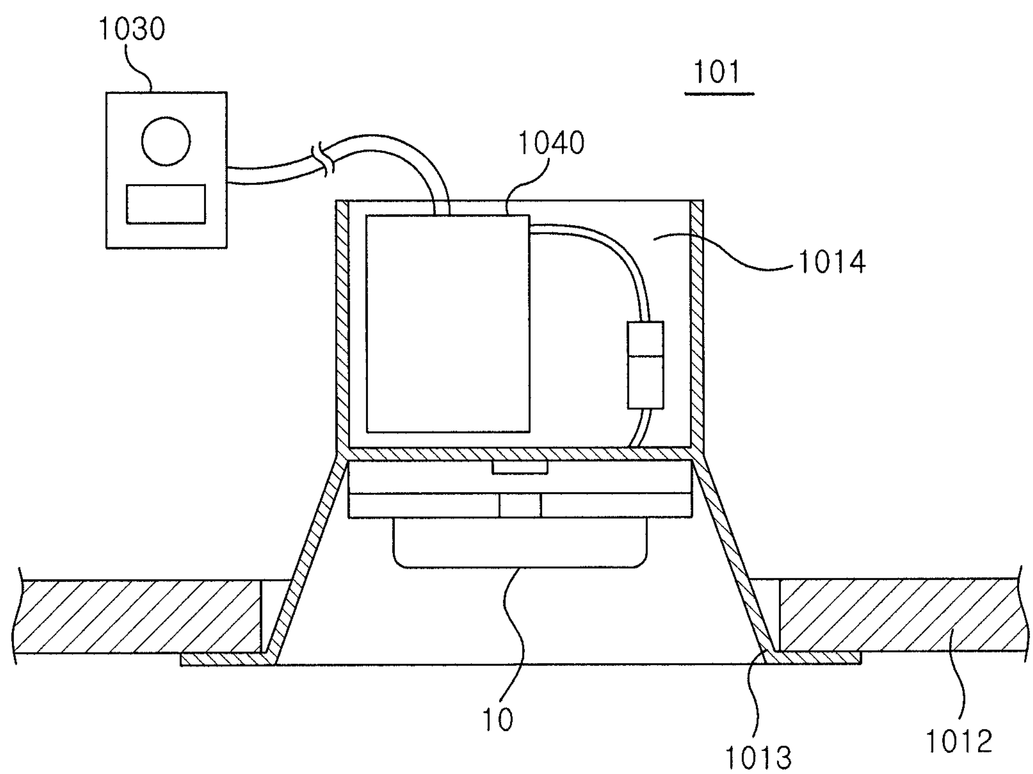
FIGS. 12A and 12B show examples of a luminaire capable of using the light emitting device and the illumination apparatus in accordance with the embodiment of the present invention, respectively.

Next, FIG. 12A illustrates a luminaire 101 using the illumination apparatus 10 shown in FIG. 1. As illustrated, the luminaire 101 is, e.g., a down light mounted to be embedded in a ceiling 1012. The illumination apparatus 10 is detachably installed in a receiving portion of a frame 1013. The drive circuit 1040 is provided in a power supply unit 1014, and controls the illumination apparatus 10 in response to the manipulation of an operation unit 1030 by a user.

In the luminaire 101 shown in FIG. 12A, the thin type illumination apparatus 10 can be detachably installed. Therefore, it is possible to enhance usage convenience in addition to the effects of the present invention.

Figure 12B:
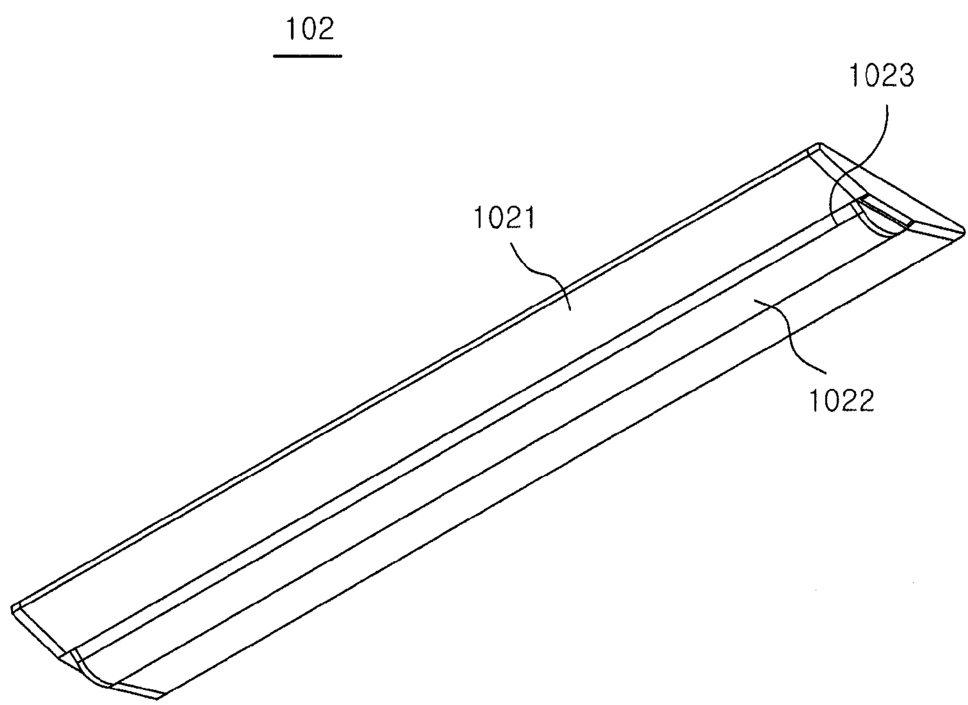

FIG. 12B illustrates a ceiling direct mounting type luminaire 102 in which the light emitting device 1 according to the present invention can be applied. The luminaire 102 includes a main body 1021 which is directly attached to a ceiling member (not shown). The light emitting device 1 (not shown) is attached to the main body 1021 via a plate-shaped attachment member 1023. Further, the light emitting device 1 is covered by a light transmitting cover 1022 made of resin such as plastic or glass.

The luminaire 102 shown in FIG. 12B can replace a luminaire using a straight tubular florescent lamp while providing increased efficiency in addition to the effects of the present invention.

Although the illumination apparatus and the luminaire using the light emitting device according to the present invention have been illustrated and described, they are merely exemplary, and the light emitting device according to the present invention may be used in various illumination apparatuses and luminaires.

While the invention has been shown and described with respect to the embodiments, it will be understood by those skilled in the art that various changes and modifications may be made without departing from the scope of the invention as defined in the following claims.

What is claimed is:

1. A light emitting device comprising:

a first luminous body that includes a first light source which emits light in a first wavelength range, and a long wavelength cut-off filter which cuts off light having a wavelength longer than a first set wavelength, the first wavelength range being set arbitrarily, the first set wavelength being set to a wavelength on a long wavelength side in the first wavelength range; and a second luminous body which generates light of different color from that of the first luminous body, and which includes a second light source that emits light in a second wavelength range, and a short wavelength cut-off filter that cuts off light having a wavelength shorter than a second set wavelength, the second wavelength range extending to a longer wavelength side than the first wavelength range while overlapping with the first wavelength range, the second set wavelength being set to a wavelength on a longer wavelength side than the first set wavelength in the second wavelength range, wherein light emitted from the first luminous body and light emitted from the second luminous body are mixed together, such that light is reduced in between the first set wavelength and the second set wavelength.

2. The light emitting device of claim 1, wherein each of the first light source and the second light source includes a solid state light emitting element, and a phosphor which wavelength-converts light emitted from the solid state light emitting element and emits the wavelength-converted light.

3. The light emitting device of claim 1, wherein the first wavelength range is a wavelength range of 420 to 650 nm, the second wavelength range is a wavelength range of 420 to 800 nm, the first set wavelength of the long wavelength cut-off filter is 560 nm, and the second set wavelength of the short wavelength cut-off filter is 620 nm.

4. The light emitting device of claim 2, wherein the first wavelength range is a wavelength range of 420 to 650 nm, the second wavelength range is a wavelength range of 420 to 800 nm, the first set wavelength of the long wavelength cut-off filter is 560 nm, and the second set wavelength of the short wavelength cut-off filter is 620 nm.

5. The light emitting device of claim 1, wherein the first wavelength range is a wavelength range of 300 to 550 nm, the second wavelength range is a wavelength range of 300 to 800 nm, the first set wavelength of the long wavelength cut-off filter is 480 nm, and the second set wavelength of the short wavelength cut-off filter is 510 nm.

6. The light emitting device of claim 2, wherein the first wavelength range is a wavelength range of 300 to 550 nm, the second wavelength range is a wavelength range of 300 to 800 nm, the first set wavelength of the long wavelength cut-off filter is 480 nm, and the second set wavelength of the short wavelength cut-off filter is 510 nm.

7. The light emitting device of claim 1, wherein the first wavelength range is a wavelength range of 300 to 550 nm, the second wavelength range is a wavelength range of 300 to 800 nm, the first set wavelength of the long wavelength cut-off filter is 470 nm, and the second set wavelength of the short wavelength cut-off filter is 500 nm.

8. The light emitting device of claim 2, wherein the first wavelength range is a wavelength range of 300 to 550 nm, the second wavelength range is a wavelength range of 300 to 800 nm, the first set wavelength of the long wavelength cut-off filter is 470 nm, and the second set wavelength of the short wavelength cut-off filter is 500 nm.

9. An illumination apparatus using the light emitting device described in claim 1.

10. An illumination apparatus using the light emitting device described in claim 2.

11. An illumination apparatus using the light emitting device described in claim 4.

12. An illumination apparatus using the light emitting device described in claim 6.

13. An illumination apparatus using the light emitting device described in claim 8.

14. A luminaire using the light emitting device described in claim 1.

15. A luminaire using the light emitting device described in claim 2.

16. A luminaire using the light emitting device described in claim 3.

17. A luminaire using the light emitting device described in claim 5.

18. A luminaire using the light emitting device described in claim 7.

19. A luminaire using the illumination apparatus described in claim 9.

20. A luminaire using the illumination apparatus described in claim 13.

21. The light emitting device of claim 1, wherein light emitted by the first light source and impinging on the first cut-off filter is in the first wavelength range and light emitted by the second light source and impinging on the second cut-off filter is in the second wavelength range.

* * * * *